(12) United States Patent
Yang et al.

(10) Patent No.: US 11,523,503 B2
(45) Date of Patent: Dec. 6, 2022

(54) WIRING BOARD AND METHOD OF FORMING HOLE THEREOF

(71) Applicant: Unimicron Technology Corp., Taoyuan (TW)

(72) Inventors: Kai-Ming Yang, Hsinchu County (TW); Chen-Hao Lin, Keelung (TW); Bo-Cheng Lin, Pingtung County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/022,128

(22) Filed: Sep. 16, 2020

(65) Prior Publication Data

US 2022/0061157 A1  Feb. 24, 2022

(30) Foreign Application Priority Data

Aug. 21, 2020 (TW) .................................. 109128669

(51) Int. Cl.
*H05K 1/11* (2006.01)
*H05K 3/40* (2006.01)

(52) U.S. Cl.
CPC ........... *H05K 1/113* (2013.01); *H05K 3/4038* (2013.01); *H05K 2201/09509* (2013.01)

(58) Field of Classification Search
CPC . H05K 1/11; H05K 3/40; H05K 1/113; H05K 3/4038; H05K 2201/09509
USPC ........................................................ 174/262
See application file for complete search history.

(56) References Cited

FOREIGN PATENT DOCUMENTS

| CN | 101785103 A | 7/2010 |
|---|---|---|
| CN | 103909351 A | 7/2014 |
| CN | 105744739 A | 7/2016 |
| TW | 333742 B | 6/1998 |
| TW | 201720247 A | 6/2017 |

*Primary Examiner* — Tremesha S Willis
(74) *Attorney, Agent, or Firm* — CKC & Partners Co., LLC (57) ABSTRACT

A wiring board includes a photosensitive insulating layer and a first wiring layer. The photosensitive insulating layer has a hole, a first surface and a second surface opposite to each other. The hole has a first end opening formed in the first surface, a second end opening formed in the second surface, an axis, and a sidewall surrounding the axis. Part of the sidewall extends toward the axis to form at least one annular flange. The first wiring layer is disposed on the first surface and includes a first pad, in which the hole exposes the first pad. There is at least one recessed cavity between the annular flange and the first pad. The minimum width of the annular flange is smaller than the maximum width of the recessed cavity.

12 Claims, 11 Drawing Sheets

WIRING BOARD AND METHOD OF FORMING HOLE THEREOF

CROSS-REFERENCE TO RELATED APPLICATION

This application claims priority to Taiwan Application Serial Number 109128669, filed Aug. 21, 2020, which is herein incorporated by reference in its entirety.

BACKGROUND

Technical Field

The present disclosure relates to a wiring board and a method of forming hole therein.

Description of Related Art

The insulating layer of the conventional wiring board (e.g., a solder mask layer or a dielectric layer in the board) has one hole or more holes, such as blind via or solder mask opening. The holes are usually filled with conductive materials, in which the conductive material is connected to a pad of a wiring layer. For example, the blind vias included in the dielectric layer in the general wiring board are usually filled with conductive pillars, and the solder mask openings included in the solder mask layer are usually filled with solder materials, in which both the conductive pillars and the solder materials are connected to the pads below to electrically connect the wiring layer.

The shape of a general hole (e.g., a blind via or a solder mask opening), that is, the shape of the inner space of the hole, is basically a frustum, so most of the holes have a relatively flat sidewall. As a result, the ability of the insulating layer to fix the conductive material (e.g., the conductive pillar or solder material) inside the hole is limited, so that it is possible to separate the conductive material and the pad below to form a crack, thereby decreasing the reliability of the wiring board.

SUMMARY

The present disclosure provides a wiring board including a photosensitive layer that assists in fixing the aforementioned conductive material.

The present disclosure further provides a method of forming a hole in the aforementioned wiring board.

A wiring board provided according to at least one embodiment in the present disclosure includes a photosensitive insulating layer and a first wiring layer. The photosensitive insulating layer has a hole, a first surface and a second surface opposite to each other. The hole has a first end opening formed in the first surface, a second end opening formed in the second surface, an axis, and a sidewall surrounding the axis. Part of the sidewall extends toward the axis to form at least one annular flange. The first wiring layer is disposed on the first surface and includes a first pad, and the hole exposes the first pad. There is at least one recessed cavity between the annular flange and the first pad. The minimum width of the annular flange is smaller than the maximum width of the recessed cavity.

A method of forming a hole in a wiring board is further provided according to at least one embodiment in the present disclosure. In the method of forming the hole, first, a photosensitive material and a first wiring layer are provided, in which the photosensitive material covers the first wiring layer, and the first wiring layer includes a first pad. Next, a predetermined area of the photosensitive material is irradiated at least once with a focused light beam, in which a focal point of the focused light beam is kept above the first pad during irradiating the predetermined area with the focused light beam. After irradiating the photosensitive material with the focused light beam, the photosensitive material is developed to form a photosensitive insulating layer having a hole.

Based on the above, by using the aforementioned annular flange and recessed cavity formed in the hole, the photosensitive insulating layer can assist in fixing the conductive material in the hole to reduce the probability of forming crack due to separation between the conductive material and the pad (first pad) connected thereto, thereby assisting in improving the reliability of the wiring board.

DETAILED DESCRIPTION

In the following description, in order to clearly present the technical features of the present disclosure, the dimensions (such as length, width, thickness, and depth) of elements (such as layers, films, substrates, and areas) in the drawings will be enlarged in unequal proportions. Therefore, the description and explanation of the following embodiments are not limited to the sizes and shapes presented by the elements in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case are mainly for illustration, and are not intended to accurately depict the actual shape of the elements, nor are they intended to limit the scope of patent applications in this case.

Secondly, the words "about", "approximately", or "substantially" appearing in the content of the present disclosure not only cover the clearly stated values and range of values, but also include those with ordinary knowledge in the technical field to which the invention belongs. The allowable deviation range, which can be determined by the error generated during the measurement, and the error is caused by the limitation of both the measurement system or the process conditions, for example. In addition, "about" may be expressed within one or more standard deviations of the above values, such as within ±30%, ±20%, ±10%, or ±5%. The words "about", "approximately" or "substantially" appearing in this text can choose acceptable deviation range or standard deviation according to optical properties, etching properties, mechanical properties or other properties, not just one Standard deviation to apply all the above optical properties, etching properties, mechanical properties and other properties.

Figure 1A:
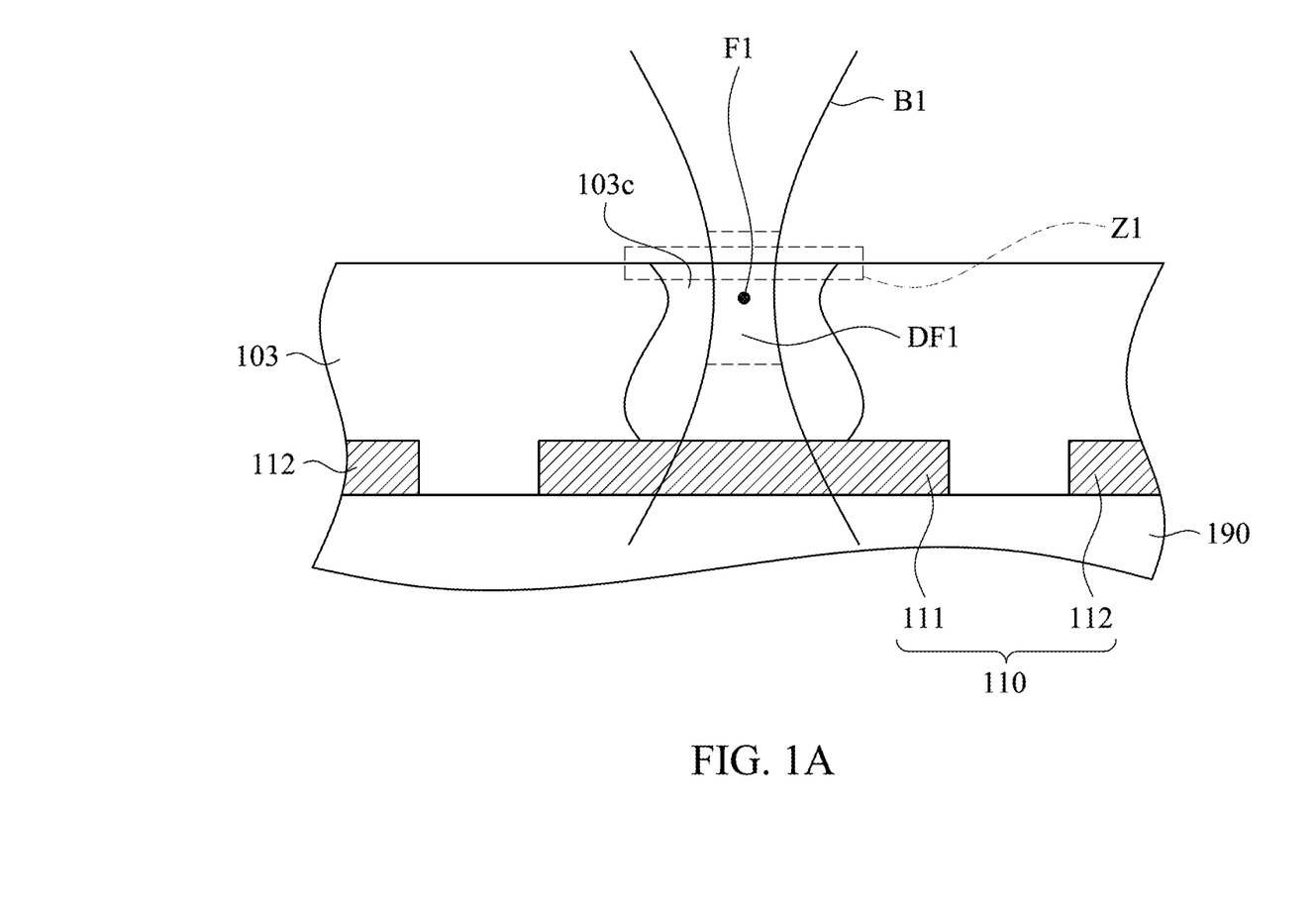
FIGS. 1A to 1C illustrate schematic cross-sectional views of a method of forming a hole in a wiring board according to at least one embodiment of the present disclosure.
Figure 1B:
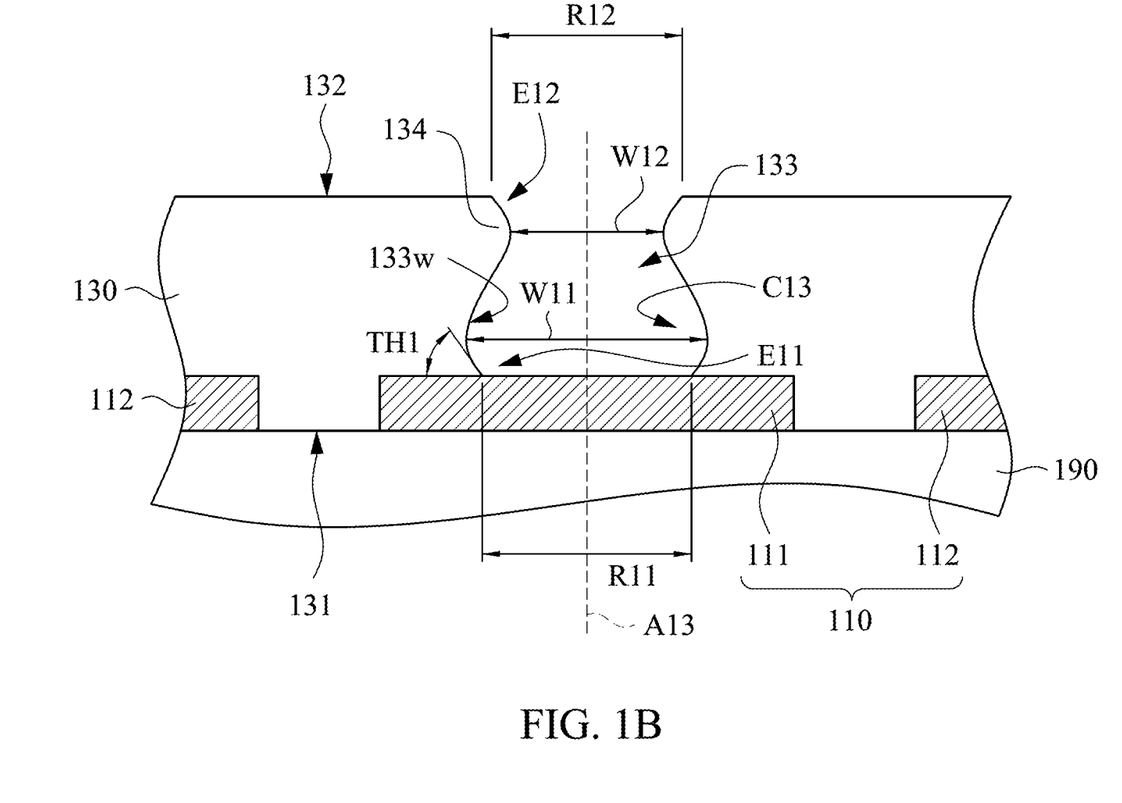
Figure 1C:
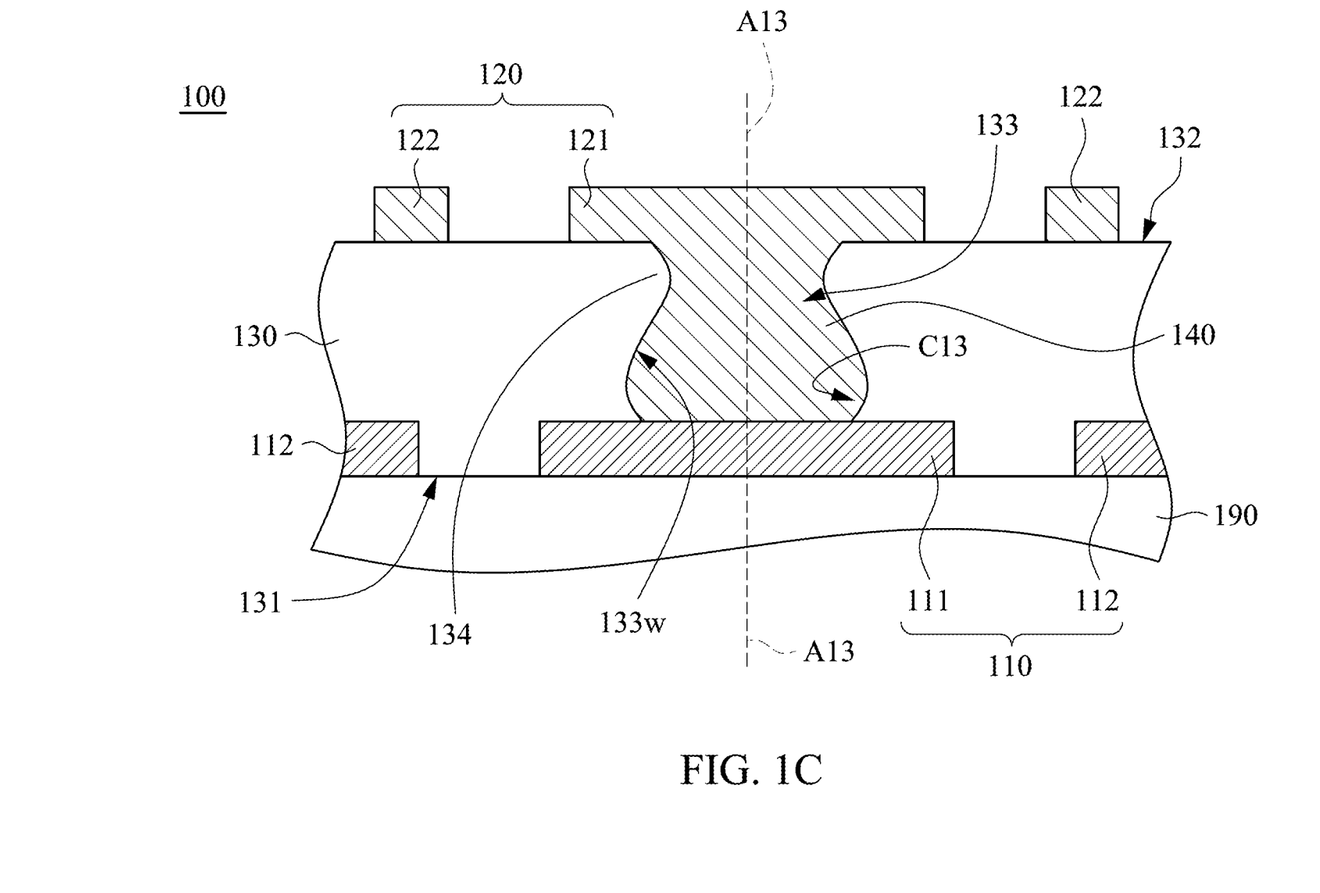

FIGS. 1A to 1C illustrate schematic cross-sectional views of a method of forming a hole in a wiring board according to at least one embodiment of the present disclosure. Reference is made to FIG. 1A. In the method of forming a hole in a wiring board in the present embodiment, first, a photosensitive material 103 and a first wiring layer 110 are provided, in which the photosensitive material 103 is, for example, a photoimageable dielectric (PID) material.

The first wiring layer 110 includes at least one first pad 111 and at least one trace 112. Taking FIG. 1A for example, the first wiring layer 110 includes one first pad 111 and a plurality of traces 112. However, in other embodiments, the first wiring layer 110 may also include multiple first pads 111 and one trace 112. Therefore, FIG. 1A is for illustration only and not used for limiting the numbers of both the first pad 111 and the trace 112.

The photosensitive material 103 covers the first wiring layer 110, and more completely covers the first pad 111 and the traces 112. The photosensitive material 103 can be formed on the first wiring layer 110 by coating or lamination. For example, the photosensitive material 103 may be an adhesive sheet or formed of a fluid material. When the photosensitive material 103 is formed of the fluid material, the photosensitive material 103 can be formed by coating, for example, spray coating, printing, or spin coating. When the photosensitive material 103 is the adhesive sheet, the photosensitive material 103 can be directly attached or laminated to the first wiring layer 110.

In the embodiment shown in FIG. 1A, the photosensitive material 103 may be formed on a wiring substrate, in which the wiring substrate includes the first wiring layer 110 and an insulating layer 190, and the photosensitive material 103 completely covers the first wiring layer 110 and the insulating layer 190. The wiring substrate may be a semi-finished product of a wiring board, in which the first wiring layer 110 is an outer wiring of the circuit substrate and formed on the insulating layer 190, whereas the insulating layer 190 may be a dielectric layer of the wiring substrate.

The aforementioned wiring substrate may further include other wiring layers other than the first wiring layer 110. For example, the wiring substrate may include two, three or more than three wiring layers (including the first wiring layer 110), in which other wiring layers are located under the insulating layer 190 except the first wiring layer 110. In other words, the photosensitive material 103 may be formed on the wiring substrate that already has multiple wiring layers, and completely covers the outer wiring of the circuit substrate (e.g., the first wiring layer 110).

Next, an exposure is performed, that is, a predetermined area Z1 of the photosensitive material 103 is irradiated at least once with a focused light beam B1. In FIG. 1A, the predetermined area Z1 is located on the upper surface of the photosensitive material 103. FIG. 1A illustrates that the predetermined area Z1 of the photosensitive material 103 is irradiated by the focused light beam B1 only once, for example. However, in other embodiments (e.g., in subsequent embodiments), the predetermined area Z1 of the photosensitive material 103 is irradiated multiple times with the focused light beam B1, that is, the same area of the surface of the photosensitive material 103 can be irradiated multiple times with the focused light beam B1. The focused light beam B1 has a focal point F1 and a depth of focus (DOF) DF1, in which the focal point F1 is located within the range of the depth of focus DF1.

During irradiating the predetermined area Z1 with the focused light beam B1, the focal point F1 of the focused light beam B1 is kept above the first pad 111 and not located on the surface of and inside the first pad 111. Taking FIG. 1A for example, the focal point F1 is located in the photosensitive material 103 and directly above the first pad 111. Once the photosensitive material 103 is irradiated with the focused light beam B1, a chemical change occurs in the part of the photosensitive material 103 which is irradiated by the focused light beam B1, so as to form a modified portion 103c.

The width of the modified portion 103c is related to the width (i.e., diameter) of the focused light beam B1. The larger the width of the focused light beam B1 is, basically, the larger the width of the modified portion 103c is. On the contrary, the smaller the width of the focused light beam B1 is, basically, the smaller the width of the modified portion 103c is. The width of the focused light beam B1 is not even, and the focused light beam B1 has a minimum width at its depth of focus DF1 so that the minimum width of the modified portion 103c approximately is located within the range of the depth of focus DF1.

It is necessary to note that although the outline of the modified portion 103c is drawn with the solid line in FIG. 1A, in fact, there is actually no apparent boundary between the modified portion 103c and the other unmodified portion of the photosensitive material 103. Therefore, the outline of the modified portion 103c drawn with the solid line in FIG. 1A is for clear description, and does not mean that there is an apparent boundary between the modified portion 103c and the other unmodified portion of the photosensitive material 103.

References are made to FIG. 1A and FIG. 1B. After the photosensitive material 103 is irradiated by the focused light beam B1, the photosensitive material 103 is developed to remove the modified portion 103c, thereby forming the photosensitive insulating layer 130. Since the modified portion 103c has been formed by the irradiation via the focused light beam B1, only the part of the photosensitive material 103 irradiated by the focused light beam B1 is removed. The other part of the photosensitive material 103 which is not irradiated by the focused light beam B1 is remained during the development. Accordingly, the photosensitive material 103 may substantially be a negative photoresist.

The photosensitive insulating layer 130 has a hole 133 and a first surface 131 and a second surface 132 opposite to each other. The hole 133 is formed by removing the modified portion 103c, so the hole 133 is formed where the modified portion 103c was located initially. In other words, the hole 133 is formed in the place where the photosensitive material 103 was irradiated by the focused light beam B1 previously, that is, the predetermined area Z1. Moreover, the first wiring layer 110 is disposed on the first surface 131 of the photosensitive insulating layer 130, and the hole 133 exposes the first pad 111 of the first wiring layer 110. Taking FIG. 1B for example, the hole 133 partially exposes the first pad 111, and the part of the first pad 111, especially the peripheral part of the first pad 111, is covered by the photosensitive insulating layer 130.

The hole 133 has an axis A13 and a sidewall 133w surrounding the axis A13. The width of the modified portion 103c is related to the diameter (i.e., width) of the focused light beam B1, and the focal point F1 of the focused light beam B1 is kept above the first pad 111 during irradiating the photosensitive material 103 with the focused light beam B1, so that the hole 133 has an inconstant diameter apparently.

Compared with the hole of the conventional wiring board in the shape of a frustum, the sidewall 133w of the hole 133 is apparently more uneven.

In the hole 133, the part of the sidewall 133w extends toward the axis A13 to form at least one annular flange 134. Taking FIG. 1B for example, the part of the sidewall 133w form one annular flange 134. However, in other embodiments, the part of the sidewall 133w may also form multiple annular flanges 134. Therefore, the annular flange 134 shown in FIG. 1B is for illustration only, and the number of annular flanges 134 in the hole 133 is not limited.

There is at least one recessed cavity C13 between the annular flange 134 and the first pad 111. FIG. 1B only shows one recessed cavity C13 for example, in which the shape of the recessed cavity C13 is ring-shaped, so that the cross-sectional diagram of the hole 133 (i.e., FIG. 1B) seems to depict two recessed cavities C13. The minimum width W12 of the annular flange 134 is smaller than the maximum width W11 of the recessed cavity C13, such that the annular flange 134 can protrude from the sidewall 133w of the hole 133 located at the recessed cavity C13. Moreover, the annular flange 134 is connected to the recessed cavity C13, and the annular flange 134 and the recessed cavity C13 form an ogee, as shown in FIG. 1B.

The hole 133 is a through hole of the photosensitive insulating layer 130, so the hole 133 extends from the first surface 131 to the second surface 132. Therefore, the hole 133 further has a first end opening E11 and a second end opening E12, in which the first end opening E11 is formed in the first surface 131, whereas the second end opening E12 is formed in the second surface 132. In the present embodiment, the difference between the inner diameter R11 of the first end opening E11 and the inner diameter R12 of the second end opening E12 may be within 10 μm.

However, in other embodiments, the difference between the inner diameter R11 and the inner diameter R12 may be a value exceeding the aforementioned range. Therefore, the difference between the inner diameter R11 and the inner diameter R12 is not limited to the aforementioned range. Furthermore, the photosensitive insulating layer 130 has an included angle TH1 formed between the sidewall 133w and the first pad 111, in which the included angle TH1 may range between 15 degrees and 45 degrees, but is not limited to this range.

Reference is made to FIG. 1C. After the photosensitive material 103 is developed to form the photosensitive insulating layer 130, a plating process is performed to the hole 133 to form a conductive material 140. The plating process may include electroless plating and electroplating. The conductive material 140 may be a solid conductive pillar, and fills the hole 133 and the recessed cavity C13, in which the conductive material 140 is connected to the first pad 111 and may be a conductive blind via.

During performing the plating process, metal can be deposited on both the second surface 132 of the photosensitive insulating layer 130 and the conductive material 140 to form a second wiring layer 120. Therefore, the second wiring layer 120 can be formed by electroless plating and electroplating, and is disposed on the second surface 132. The second wiring layer 120 includes a second pad 121 and a plurality of traces 122, in which the second pad 121 is disposed on and connected to the conductive material 140 such that the conductive material 140 is connected between the first pad 111 and the second pad 121. In this way, the first wiring layer 110 can be electrically connected to the second wiring layer 120 through the conductive material 140.

In the process of forming the second wiring layer 120, first, a thin metal layer can be formed on the second surface 132 of the photosensitive insulating layer 130 to be used as a seed layer. The thin metal layer can be formed by sputtering or evaporation. Alternatively, the thin metal layer may also be a thinned metal foil (e.g., a copper foil). The traces 122 of the second wiring layer 120 can be formed by deposition of metal on the thin metal layer by plating, in which a semi-additive process can be performed on the thin metal layer to form the traces 122 by using the thin metal layer. Moreover, the traces 122 can also be formed by a subtractive process. Thus, forming the traces 122 is not limited to the semi-additive process only.

The second pad 121 may be formed by continuously performing the aforementioned plating process after the conductive material 140 is formed. Hence, both the second pad 121 and the conductive material 140 can be integrally formed into one so that no seam exists between the second pad 121 and the conductive material 140. So far, a wiring board 100 including the photosensitive insulating layer 130, the first wiring layer 110, the second wiring layer 120 and the conductive material 140 is basically complete.

It should be noted that in the embodiment shown in FIG. 1C, the second wiring layer 120 includes one second pad 121 and a plurality of traces 122. However, in other embodiments, the second wiring layer 120 may also include a plurality of second pads 121 and one trace 122. Therefore, FIG. 1C is for illustration only and not used for limiting the number of the second pad 121 and traces 122 included by the wiring board 100.

By using the annular flange 134 and the recessed cavity C13 formed in the hole 133, the conductive material 140 can be embedded in the hole 133 and thus firmly fixed in the hole 133. Accordingly, compared with the conventional frustum-shaped hole, the hole 133 and the conductive material 140 embedded in the hole 133 have a structure similar to a rivet. As a result, the sidewall of the photosensitive insulating layer 130 can fasten the conductive material to strengthen the conductive material fixed in the hole 133, thereby reducing the probability of occurring the crack between the conductive material 140 and the first pad 111 by virtue of separation. Hence, it assists in improving the reliability of the wiring board 100.

It is worth mentioning that the wiring board 100 in FIG. 1C may also be a semi-finished product. Specifically, another wiring layer can be additionally formed on the second wiring layer 120 and the photosensitive insulating layer 130 in FIG. 1C, in which the wiring layer can be formed by build-up method or stackup method. Taking the build-up method for example, another layer of photosensitive material 103 can be formed on the second wiring layer 120 and the photosensitive insulating layer 130, where the photosensitive material 103 covers the second wiring layer 120 and the photosensitive insulating layer 130.

Next, according to the method disclosed in FIG. 1A and FIG. 1B, another photosensitive insulating layer 130 is formed on the second wiring layer 120, in which another hole 133 is formed above the second pad 121. Afterwards, the plating process is performed again to form the conductive material 140 in the hole 133 above the second pad 121, and another wiring layer is formed on the additionally-formed photosensitive insulating layer 130, in which this wiring layer can be electrically connected to the second pad 121 through the conductive material 140. In this way, other wiring layer can be additionally formed on the second wiring layer 120 and the photosensitive insulating layer 130.

Furthermore, the photosensitive insulating layer 130 formed of the photosensitive material 103 may have rigidity or flexibility, so the wiring board 100 may be a flexible wiring board or a rigid wiring board. Alternatively, the wiring board 100 may be a flexible wiring substrate or a rigid wiring substrate in a rigid-flex wiring board.

FIGS. 2A to 2E illustrate schematic cross-sectional views of a method of forming a hole in a wiring board according to another embodiment of the present disclosure. References are made to FIG. 2A to FIG. 2C. The hole forming method of the present embodiment is similar to the hole forming method of the previous embodiment, but the main difference is that in the hole forming method shown in FIG. 2A to FIG. 2E, the predetermined area Z1 of the photosensitive material 103 is irradiated multiple time with the focused light beam B1. The following description mainly explains the differences between the present embodiment and the aforementioned embodiment.

Figure 2A:
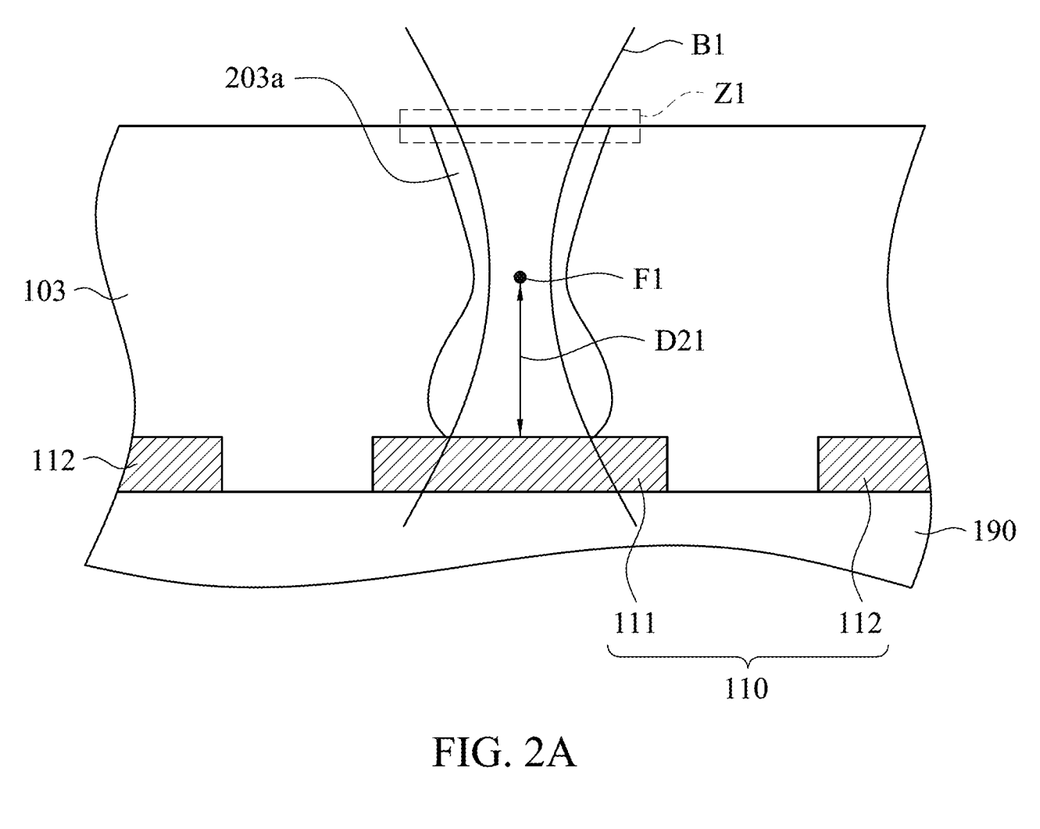
FIGS. 2A to 2E illustrate schematic cross-sectional views of a method of forming a hole in a wiring board according to another embodiment of the present disclosure.
Figure 2B:
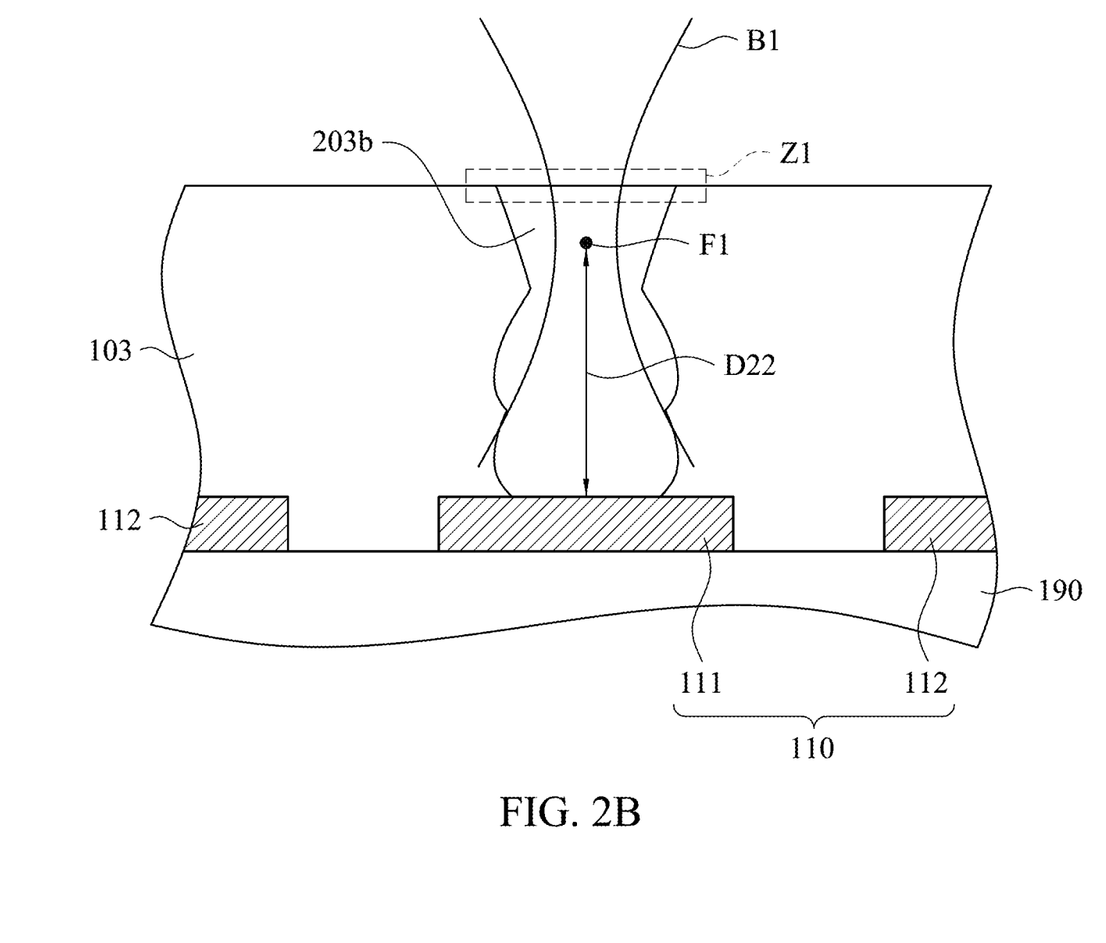
Figure 2C:
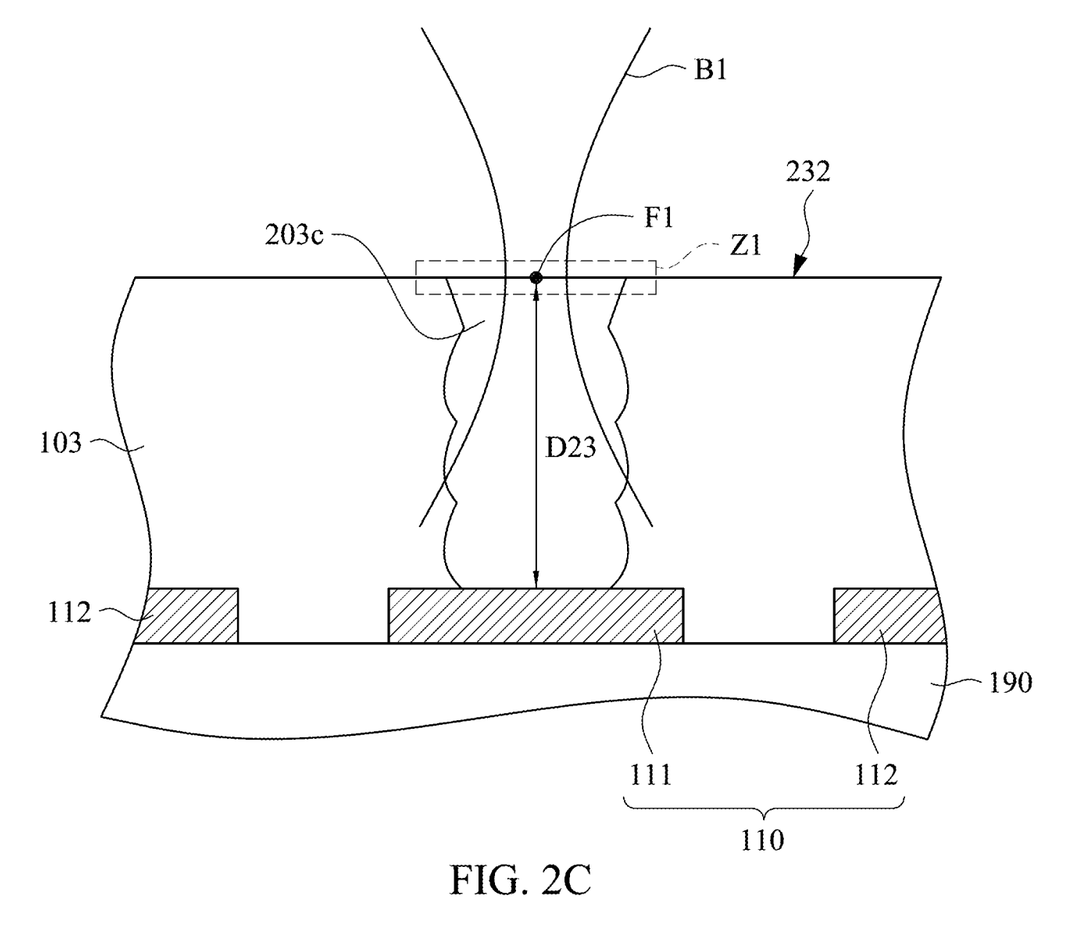

After the photosensitive material 103 and the first wiring layer 110 are provided, the predetermined area Z1 of the photosensitive material 103 is irradiated multiple times with the focused light beam B1. During irradiating the predetermined area Z1 multiple times with the focused light beam B1, the distance between the focal point F1 of the focused light beam B1 and the first pad 111 is D(n) when the predetermined area Z1 is irradiated for the nth time with the focused light beam B1, in which n is a positive integer. When the predetermined area Z1 is irradiated for the (n+1)th time with the focused light beam B1, the distance between the focal point F1 and the first pad 111 is D(n+1), in which D(n)≤D(n+1).

FIGS. 2A to 2C illustrate irradiating the predetermined area Z1 three times with the focused light beam B1, for example. Referring to FIG. 2A first, when the predetermined area Z1 of the photosensitive material 103 is irradiated for the first time with the focused light beam B1, the part of the photosensitive material 103 which is irradiated by the focused light beam B1 forms a modified portion 203a, and a distance D21 exists between the focal point F1 of the focused light beam B1 and the first pad 111. Reference is made to FIG. 2B. When the predetermined area Z1 is irradiated for the second time with the focused light beam B1, the part of the photosensitive material 103 which is irradiated twice by the focused light beam B1 forms a modified portion 203b, and a distance D22 exists between the focal point F1 and the first pad 111, in which a part of the modified portion 203a is repeatedly irradiated by the focused light beam B1.

Comparing FIG. 2A with FIG. 2B, it can be seen that the distance D21 is apparently smaller than the distance D22. That is to say, in the process of irradiating the predetermined area Z1 for the first time and the second time with the focused light beam B1, the position of the focal point F1 is not fixed, such that the part of the photosensitive material 103 which is irradiated by the focused light beam B1 for the first time is apparently different from the part of the photosensitive material 103 which is irradiate by the focused light beam B1 for the second time. During irradiating the predetermined area Z1 for the second time with the focused light beam B1, the part of the photosensitive material 103 which was not irradiated previously is irradiated with the focused light beam B1, so the size of the modified portion 203b is larger than the size of the modified portion 203a, where the modified portion 203b includes the previous modified part 203a.

Reference is made to FIG. 2C. When the predetermined area Z1 is irradiated for the third time with the focused light beam B1, the part of the photosensitive material 103 which is illuminated by the focused light beam B1 forms a modified portion 203c, and a distance D23 exists between the focal point F1 and the first pad 111. At this time, the focal point F1 may be near the second surface 232 of the photosensitive material 103, as shown in FIG. 2C. Alternatively, the focal point F1 may also be located inside the photosensitive material 103 below the second surface 232. Comparing FIG. 2B with FIG. 2C, it can be seen that the distance D22 is apparently smaller than the distance D23.

During irradiating the predetermined area Z1 for the third time with the focused light beam B1, a part of each of the modified portions 203a and 203b is repeatedly irradiated by the focused light beam B1, and the part of the photosensitive material 103 which was not irradiated twice previously is irradiated with focused light beam B1. Accordingly, the size of the modified portion 203c formed by the third irradiation is larger than the size of any one of the modified portions 203b and 203a formed by the first and the second irradiation respectively, and the modified portion 203c includes the previous modified portions 203a and 203b.

Therefore, in the process of irradiating the predetermined area Z1 multiple times with the focused light beam B1, the position of the focal point F1 is apparently changed with each irradiation of the photosensitive material 103 via the focused light beam B1. When the predetermined area Z1 is irradiated for the first time with the focused light beam B1, the focal point F1 is closest to the first pad 111. After that, as the number of times of the irradiation of the predetermined area Z1 via the focused light beam B1 increases, the focal point F1 gradually moves away from the first pad 111. Moreover, during irradiating the predetermined area Z1 multiple times with the focused light beam B1, the focal point F1 may be kept inside the photosensitive material 103 and within the second surface 232.

Figure 2D:
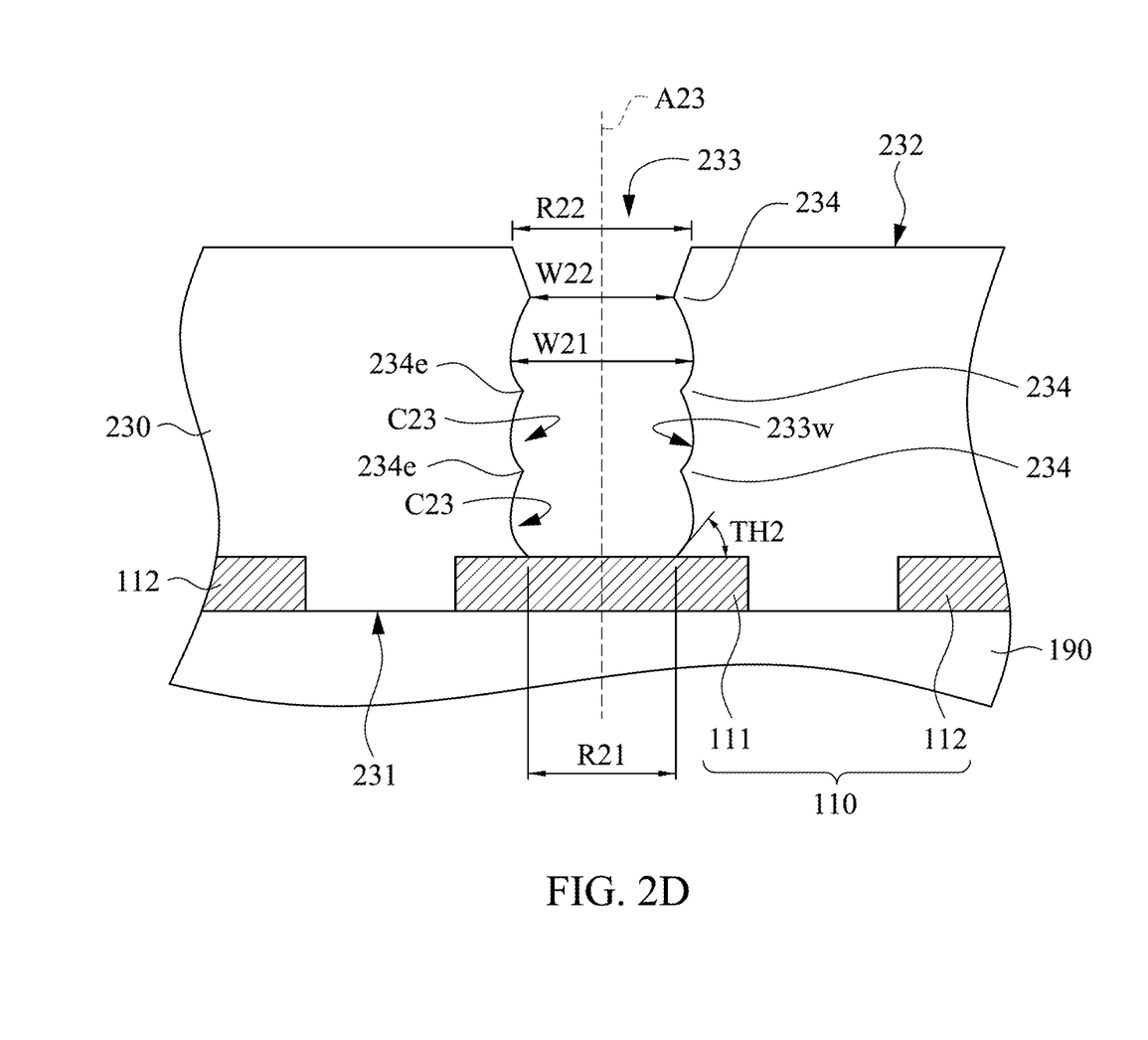

References are made to FIG. 2C and FIG. 2D. After irradiating the photosensitive material 103 with the focused light beam B1, the photosensitive material 103 is developed to remove the modified portion 203c, thereby forming a photosensitive insulating layer 230 having a hole 233, in which the hole 233 is formed by removing the modified portion 203c, such that the hole 233 is formed in the part of the photosensitive material 103 irradiated by the focused light beam B1, that is, the predetermined area Z1.

The photosensitive insulating layer 230 further has a first surface 231 and a second surface 232 opposite to each other, in which the first wiring layer 110 is disposed on the first surface 231. The hole 233 is a through hole of the photosensitive insulating layer 230, so the hole 233 extends from the second surface 232 to the first surface 231 to expose the first pad 111, in which the hole 233 can partially expose the first pad 111. In addition, the photosensitive insulating layer 230 may have an included angle TH2 formed between the sidewall 233w and the first pad 111. The included angle TH2 may range between 15 degrees and 45 degrees, but is not limited to this range.

The hole 233 is formed by removing the modified portion 203c, and the modified portion 203c is formed by irradiating the photosensitive material 103 multiple times with the focused light beam B1, in which the position of the focal point F1 is changed with each time the focused light beam B1 hits the predetermined area Z1, so that the hole 233 has an inconstant diameter apparently, and the sidewall 233w of the hole 233 is uneven apparently, as shown in FIG. 2D.

The hole 233 has an axis A23, and part of the sidewall 233w extends toward the axis A23 to form a plurality of annular flanges 234. There are a plurality of recessed cavities C23 between one of the annular flanges 234 and the first pad 111, where one of the recessed cavities C23 is formed between two adjacent annular flanges 234. Taking FIG. 2D for example, the sidewall 233w forms three annular flanges 234, and there are three recessed cavities C23 between the uppermost annular flange 234 and the first pad 111, in which the upper two recessed cavities C23 are individually formed between two adjacent annular flanges 234.

Referring to FIG. 2D, the sidewall 233w located at each recessed cavity C23 has a concave surface, whereas each annular flange 234 has an acute edge 234e, where at least one acute edge 234e is formed between two adjacent recessed cavities C23. The minimum width W22 of the annular flange 234 is smaller than the maximum width W21 of the recessed cavity C23, such that each annular flange 234 can protrude from the sidewall 233w of the hole 233 located at the recessed cavity C23. In addition, the difference between the inner diameter R21 of the first end opening (not labeled) and the inner diameter R22 of the second end opening (not labeled) both in the hole 233 may also be within 10 μm. However, the difference between the inner diameter R21 and the inner diameter R22 is not limited to the above range.

Figure 2E:
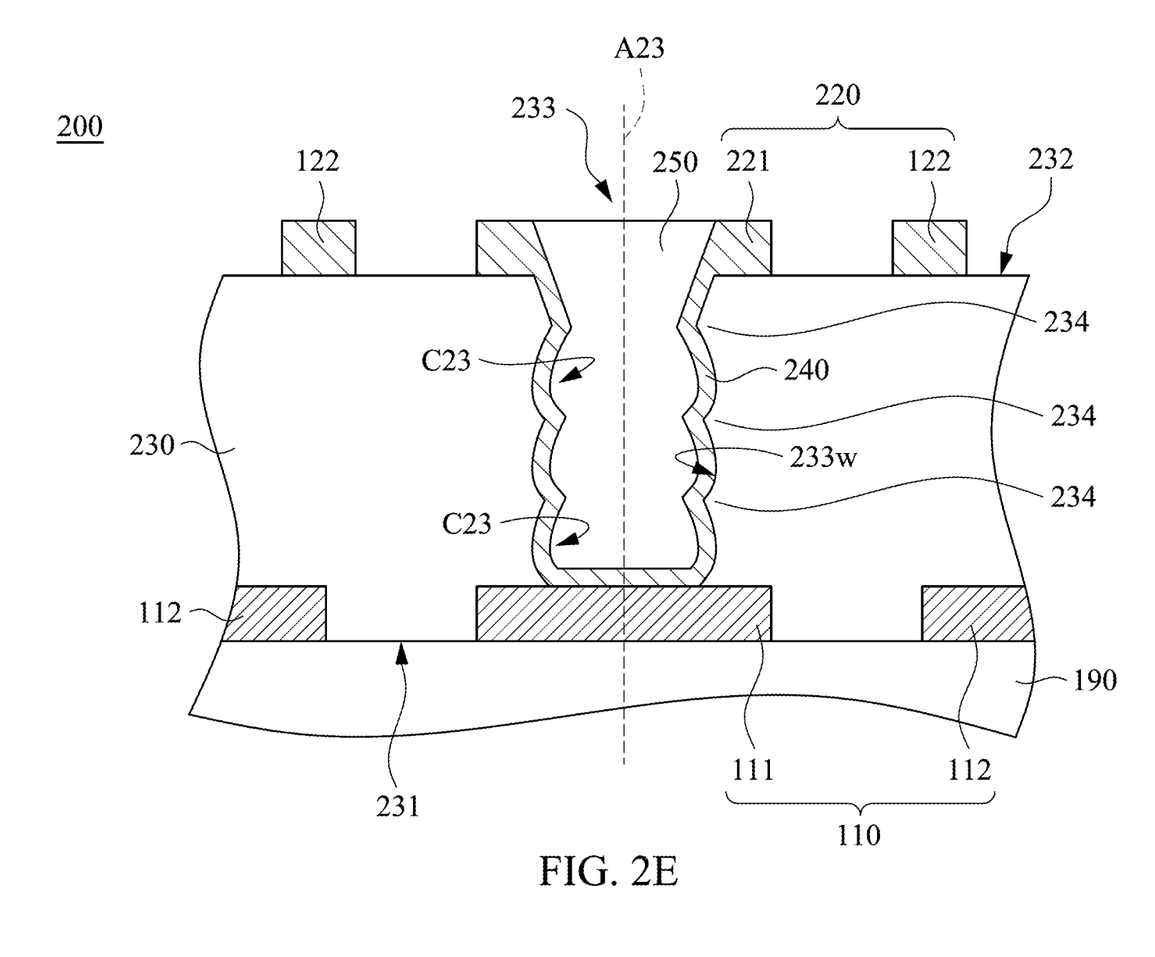

Reference is made to FIG. 2E. After the photosensitive insulating layer 230 is formed, a plating process is performed to the hole 233, in which the plating process in the present embodiment may be substantially the same as the plating process in the aforementioned embodiment. However, it is different from the aforementioned embodiment that a conductive layer 240 can be formed in the hole 233 by the plating process in the present embodiment, in which the conductive layer 240 covers the sidewall 233w completely, but the hole 233 is not full of the conductive layer 240. For example, the conductive layer 240 may conformally cover the sidewall 233w. In other words, the conductive layer 240 may be a hollow conductive pillar, and may be a conductive blind via.

Since the hole 233 is not full of the conductive layer 240 that completely covers the sidewall 233w, the top of the conductive layer 240 shown in FIG. 2E has an opening (not labeled). A filling material 250 can fill the hole 233 from the opening at the top of the conductive layer 240, such that the filling material 250 can fill the hole 233, in which the filling material 250 may be an ink. After the filling material 250 fills the hole 233, the conductive layer 240 covers the filling material 250, as shown in FIG. 2E.

It is similar to the plating process in the aforementioned embodiment that during performing the plating process to the hole 233, metal can be deposited on the second surface 232 of the photosensitive insulating layer 230 to form a second wiring layer 220 disposed on the second surface 232. The second wiring layer 220 includes at least one second pad 221 and a plurality of traces 122, and the conductive layer 240 is connected between the first pad 111 and the second pad 221. Both the second pad 221 and the conductive layer 240 can be formed by the same plating process, and the second pad 221 and the conductive layer 240 can be integrally into one. Accordingly, there is no seam between the second pad 221 and the conductive layer 240.

It is different from the second pad 121 that in the aforementioned embodiment, the second pad 221 has an opening (not labeled), where the opening at the top of the conductive layer 240 extends to the second wiring layer 220, so the filling material 250 can fill the hole 233 from the opening of the second wiring layer 220. So far, a wiring board 200 including the photosensitive insulating layer 230, the first wiring layer 110, the second wiring layer 220, the conductive layer 240, and the filling material 250 is basically complete.

It is necessary to note that in the embodiment shown in FIG. 2E, the second wiring layer 220 includes one second pad 221 and a plurality of traces 122. However, in other embodiments, the second wiring layer 220 may also include a plurality of second pads 221 and one trace 122. Accordingly, FIG. 2E is for illustration only and not used for limiting the numbers of the second pad 221 and the trace 122 included in the wiring board 200.

It is worth mentioning that in the embodiment shown in FIG. 2E, the hole 233 is filled with the filling material 250 and the conductive layer 240, and no other insulating layer and other wiring layer are formed on the second wiring layer 220. However, in other embodiments, an insulating layer and a wiring layer may be additionally formed on the second wiring layer 220, in which the insulating layer may be the photosensitive insulating layer 230, and the holes 233 may be filled with the photosensitive insulating layer 230 and the conductive layer 240. In addition, the insulating layer and the wiring layer on the second wiring layer 220 can be formed by build-up method or stackup method. The following description takes the build-up method for example to specifically describe the method of additionally forming an insulating layer and a wiring layer on the second wiring layer 220.

It is similar to the method of forming the hole 233 that under the condition of omitting the filling material 250, another layer of photosensitive material 103 can be formed on the second wiring layer 220 and the photosensitive insulating layer 230 shown in FIG. 2E. The aforementioned photosensitive material 103 not only covers the second wiring layer 220, but also fill the hole 233. In this way, the hole 233 can be filled with the photosensitive insulating layer 230 and the conductive layer 240. Certainly, the filling material 250 in FIG. 2E may be remained, such that the photosensitive material 103 can cover both the second wiring layer 220 and the filling material 250, but not fill the hole 233.

Next, the photosensitive material 103 is irradiated multiple times with the focused light beam B1. Afterwards, the photosensitive material 103 irradiated by the focused light beam B1 is developed to form the hole 233 in the second wiring layer 220. Then, the plating process is performed to form the conductive material 140 or the conductive layer 240 in the hole 233. In this way, the hole 233 in FIG. 2E can be filled with the photosensitive insulating layer 230 and the conductive layer 240, and other insulating layer and wiring layer can be formed on the second wiring layer 220. Moreover, in the method for additionally forming an insulating layer and a wiring layer on the second wiring layer 220, the focused light beam B1 may hit the photosensitive material 103 on the second wiring layer 220 only once to form the hole 133 as shown in FIG. 1B.

It is similar to the aforementioned embodiment that the photosensitive insulating layer 230 formed of the photosensitive material 103 may also have rigidity or flexibility, so the wiring board 200 may be a flexible wiring board or a rigid wiring board, or a flexible wiring substrate or a rigid wiring substrate in a rigid-flex wiring board. Under the condition that the photosensitive insulating layer 230 is flexible, since the conductive layer 240 is a hollow conductive pillar, the conductive layer 240 can help to increase the flexibility of the wiring board 200, so the wiring board 200 is the flexible wiring board or the flexible wiring substrate in the rigid-flex wiring board with good flexibility.

It is necessary to note that in the aforementioned embodiments shown in FIG. 1A to FIG. 2E, since the wiring substrate including the first wiring layer 110 and the insulating layer 190 may include two, three or more wiring layers, the wiring board 100 or 200 may be a multilayer wiring board with more than three wiring layers (including the first wiring layer 110 and the second wiring layer 120 or 220). However, in other embodiments, the wiring board 100 may be a double-sided wiring board with only two wiring layers. Hence, FIG. 1A to FIG. 1C and FIG. 2A to FIG. 2E are for illustration only and not used for limiting the types of the wiring boards 100 and 200 and the number of the wiring layers included therein.

Moreover, in the hole 233 shown in FIG. 2E, both the conductive layer 240 and the filling material 250 can be replaced with a solid conductive pillar (like the conductive material 140 shown in FIG. 1C). On the contrary, in the hole 133 shown in FIG. 1C, the conductive material 140 can also be replaced with a hollow conductive pillar and a filling material (like the conductive layer 240 and the filling material 250 shown in FIG. 2E), in which the filling material may be a photosensitive material 103. In other words, the holes 133 and 233, the conductive material 140, the conductive layer 240 and the filling material 250 can all be applied to the wiring boards 100 and 200.

Figure 3A:
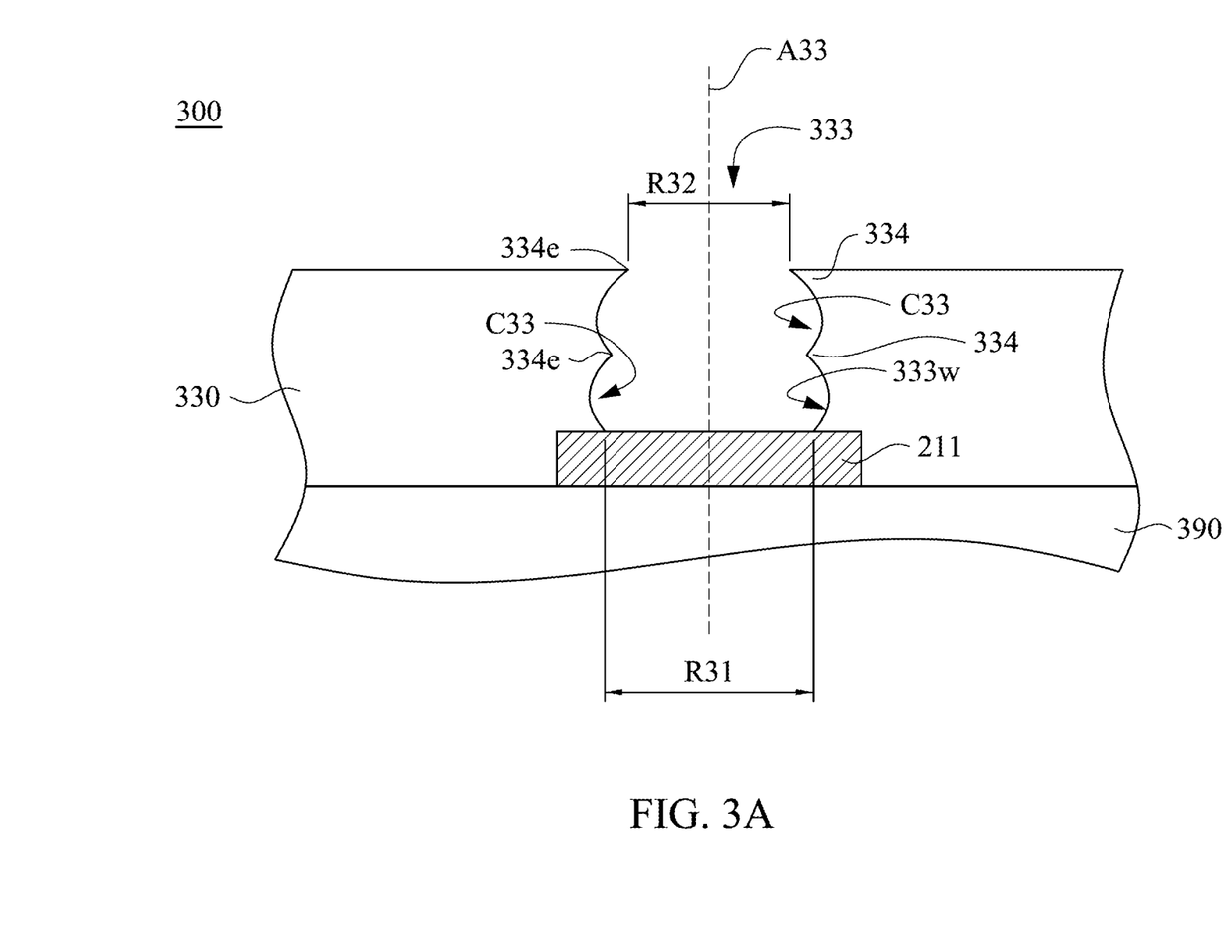
FIG. 3A and FIG. 3B illustrate schematic cross-sectional views of a method of forming a hole in a wiring board according to another embodiment of the present disclosure.
Figure 3B:
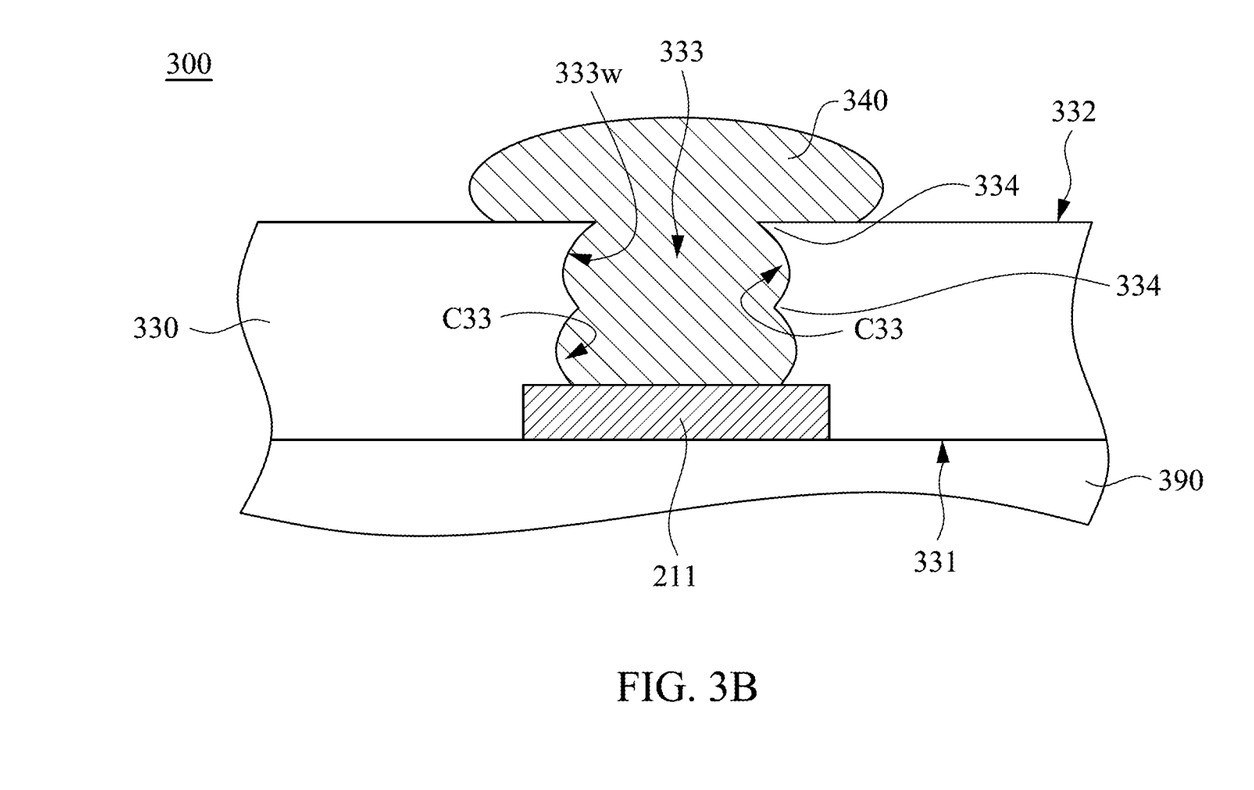

FIG. 3A and FIG. 3B illustrate schematic cross-sectional views of a method for forming a hole in a wiring board according to another embodiment of the present disclosure. References are made to FIG. 3A and FIG. 3B. The present embodiment is similar to the aforementioned embodiment. For example, the hole forming method shown in FIG. 3A and FIG. 3B is similar to the hole forming method shown in FIG. 2A to FIG. 2E. Thus, the following description mainly explains the main difference between the present embodiment and the aforementioned embodiment, that is, the hole forming method shown in FIG. 3A and FIG. 3B is used to form a solder mask opening, and the photosensitive insulating layer 330 shown in FIG. 3A and FIG. 3B is a solder mask layer.

Reference is made to FIG. 3A, after the photosensitive material 103 irradiated by the focused light beam B1 (not shown in FIG. 3A) at least once is developed, a photosensitive insulating layer 330 with a hole 333 is formed and a solder mask layer. The photosensitive insulating layer 330 further has a first surface 331 and a second surface 332 opposite to each other. The hole 333 exposes a first pad 211 of the first wiring layer, and the first wiring layer is disposed on the first surface 331 of the photosensitive insulating layer 330. The photosensitive insulating layer 330 covers the traces (not shown) of the first wiring layer, and partially covers the first pad 211, especially the peripheral part of the first pad 211. The first wiring layer (including the first pad 211) is the outermost wiring layer, and the first pad 211 is solder-mask defined (SMD).

After the hole 333 is formed, a wiring board 300 including the photosensitive insulating layer 330 and the first wiring layer (including the first pad 211) is basically complete and prepared for supplying the downstream manufacturers, such as packaging and testing plants. In addition, the wiring board 300 may further include an insulating layer 390, in which the first wiring layer is formed on the insulating layer 390, and the wiring board 300 may further include at least one wiring layer under the insulating layer 390.

FIG. 3A illustrates irradiating the photosensitive material 103 multiple times with the focused light beam B1, for example, where the hole 333 shown in FIG. 3A is formed by irradiating the same position (i.e., the predetermined zone Z1) of the photosensitive material 103 twice with the focused light beam B1 and the subsequent development. Hence, the part of the sidewall 333w of the hole 333 extends toward the axis A33 of the hole 333 to form a plurality of annular flanges 334, as shown in FIG. 3A.

There are a plurality of recessed cavities C33 between the uppermost annular flange 334 and the first pad 211, and the upper recessed cavity C33 is formed between two adjacent annular flanges 334, in which each annular flange 334 has an acute edge 334e, and the lower acute edge 334e is formed between two adjacent recessed cavities C33. Referring to FIG. 3A, the minimum width of the annular flange 334 is apparently smaller than the maximum width of the recessed cavity C13.

The difference between the inner diameter R31 of the first end opening (not labeled) and the inner diameter R32 of the second end opening (not labeled) both in the hole 333 may be within 10 μm. However, the difference between the inner diameter R31 and the inner diameter R32 is not limited to the above range. Moreover, the photosensitive insulating layer 330 may have an included angle formed between the sidewall 333w and the first pad 211 which may range between 15 degrees and 45 degrees, like the included angle TH1 or TH2 in the aforementioned embodiments, but the included angle is not limited to this range.

Reference is made to FIG. 3B. Next, the conductive material 340 fills in the hole 333. The conductive material 340 may be a solder material and be filled in the hole 333 by printing or spraying. After the conductive material 340 fills the hole 333, the conductive material 340 can heat up so as to melt the conductive material 340. In this way, the wiring board 300 may further include the conductive material 340, in which the conductive material 340 can completely fill the entire hole 333 and protrude from the second surface 332.

Figure 4:
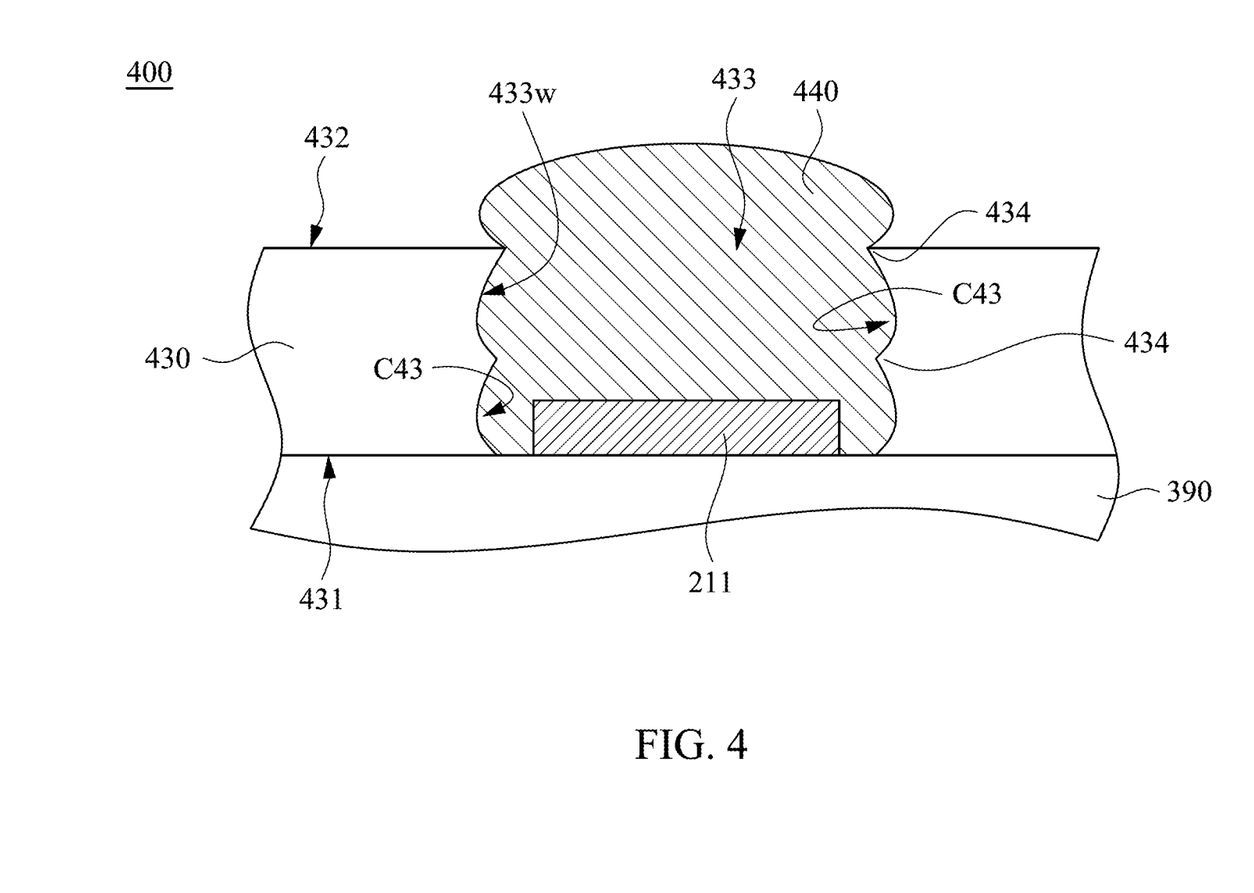
FIG. 4 illustrates a schematic cross-sectional view of a wiring board according to at least one embodiment of the present disclosure.

FIG. 4 illustrates a schematic cross-sectional view of a wiring board according to at least one embodiment of the present disclosure. Reference is made to FIG. 4. The wiring board 400 shown in FIG. 4 is similar to the wiring board 300 shown in FIG. 3B. For example, the wiring board 400 includes a photosensitive insulating layer 430, a first pad 211 and a conductive material 440. The photosensitive insulating layer 430 has a hole 433, a first surface 431 and a second surface 432 opposite to each other. The methods for forming the holes 433 and 333 are the same.

The sidewall 433w of the hole 433 forms one annular flange 434 or a plurality of annular flanges 434. In FIG. 4, there are a plurality of recessed cavities C43 between the uppermost annular flange 434 and the first pad 211 (FIG. 4 shows two recessed cavities C43), and the uppermost recessed cavity C43 is formed between two adjacent annular flanges 434. The conductive material 340 is a solder material and able to completely fill the entire hole 333, in which the conductive material 340 protrudes from the second surface 432. Moreover, in other embodiments, the wiring board 400 may not include the conductive material 340, that is, the conductive material 340 shown in FIG. 4 may be omitted.

However, it is different from the aforementioned wiring board 300 that in the wiring board 400, the hole 433 of the photosensitive insulating layer 430 has a diameter larger than the width of the first pad 211, such that the photosensitive insulating layer 430 neither covers nor touches the first pad 211. Therefore, it is different from the first pad 211 which is solder mask defined (SMD) shown in FIG. 3B that the first pad 211 shown in FIG. 4 is non-solder-mask defined (NSMD).

It is emphasized that in the aforementioned embodiments, the number of the holes (e.g., the holes 133, 233, 333, or 433) shown in each drawing is only one. However, in other embodiments, the number of the holes in the wiring board may be multiple. Therefore, each of the wiring boards 100 to 400 disclosed in the aforementioned embodiments may have a lot of holes, and the number of the holes in each of the wiring boards 100 to 400 is not limited by the aforementioned drawings.

In summary, by using the aforementioned annular flange and the recessed cavity, the conductive material (e.g., the conductive pillar or solder material) can be embedded into the hole so as to be firmly fixed in the hole. Therefore, the photosensitive insulating layer disclosed in at least one embodiment of the present disclosure can assist in fixing the conductive material in the hole to reduce the probability of forming crack due to separation between the conductive material and the first pad, thereby improving reliability. As a result, compared with the conventional wiring board, the wiring board of at least one embodiment in the present disclosure has better reliability.

Although the present disclosure has been described in considerable detail with reference to certain embodiments thereof, other embodiments are possible. It will be apparent to those skilled in the art that various modifications and variations can be made to the structure of the present disclosure without departing from the scope or spirit of the disclosure. Therefore, the spirit and scope of the appended claims should not be limited to the description of the embodiments contained herein.

What is claimed is:

1. A wiring board, comprising:
   a photosensitive insulating layer made of a negative photoresist and having a hole, a first surface and a second surface opposite to each other, wherein the hole has a first end opening formed in the first surface, a second end opening formed in the second surface, an axis and a sidewall surrounding the axis, and part of the sidewall extends toward the axis to form at least one annular flange; and
   a first wiring layer disposed on the first surface and comprising a first pad, wherein the hole exposes the first pad, and there is at least one recessed cavity between the at least one annular flange and the first pad, wherein a minimum width of the at least one annular flange is smaller than a maximum width of the at least one recessed cavity, wherein the first pad protrudes from neither the first surface nor the second surface.

2. The wiring board of claim 1, wherein a difference between the inner diameter of the first end opening and the inner diameter of the second end opening is within 10 μm.

3. The wiring board of claim 1, wherein the annular flange is connected to the first pad, and the annular flange and the recessed cavity form an ogee.

4. The wiring board of claim 1, wherein part of the sidewall extends toward the axis to form a plurality of the annular flanges, and there are a plurality of the recessed cavities between one of the annular flanges and the first pad, wherein one of the recessed cavities is formed between two adjacent annular flanges.

5. The wiring board of claim 4, wherein the sidewall located in each of the recessed cavities has a concave surface, and each of the annular flanges has an acute edge, wherein at least one of the acute edges is formed between two adjacent recessed cavities.

6. The wiring board of claim 1, further comprising:
   a conductive material filling the hole and the at least one recessed cavity, and connected to the first pad.

7. The wiring board of claim 6, wherein the conductive material protrudes from the second surface.

8. The wiring board of claim 6, wherein the photosensitive insulating layer does not touch the first pad.

9. The wiring board of claim 6, further comprising:
   a second wiring layer disposed on the second surface and comprising a second pad, wherein the conductive material is connected between the first pad and the second pad.

10. The wiring board of claim 1, further comprising a conductive layer, wherein the conductive layer completely covers the sidewall of the hole, and the hole is not full of the conductive layer.

11. The wiring board of claim 10, further comprising a filling material, wherein the filling material fills the hole, and the conductive layer covers the filling material.

12. The wiring board of claim 1, wherein the photosensitive insulating layer has an included angle formed between the sidewall and the first pad, wherein the included angle ranges between 15 degrees and 45 degrees.

* * * * *